(12) United States Patent
Sasaki et al.

(10) Patent No.: US 6,296,784 B1
(45) Date of Patent: *Oct. 2, 2001

(54) CESIUM-LITHIUM-BORATE CRYSTAL AND ITS APPLICATION TO FREQUENCY CONVERSION OF LASER LIGHT

(75) Inventors: Takatomo Sasaki, Osaka; Akio Hiraki, Hyogo; Yusuke Mori; Sadao Nakai, both of Osaka, all of (JP)

(73) Assignee: Research Development Corporation of Japan, Saitama (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 181 days.

(21) Appl. No.: 08/503,083

(22) Filed: Jul. 17, 1995

(30) Foreign Application Priority Data

Jul. 18, 1994 (JP) ................................................. 6-165664
May 26, 1995 (JP) ................................................. 7-128698

(51) Int. Cl.$^7$ ............................. C01B 35/10; G02B 5/20; C30B 15/00; C30B 29/16
(52) U.S. Cl. .......................... 252/584; 423/277; 117/13; 117/74; 117/944; 359/328; 359/330; 372/21; 372/22; 372/39; 372/41
(58) Field of Search ................................ 423/277; 372/21, 372/22, 39, 41; 359/328, 330; 117/944, 13, 74; 252/584

(56) References Cited

U.S. PATENT DOCUMENTS

| | | | |
|---|---|---|---|
| 3,934,154 | * | 1/1976 | Cook, Jr. ............................ 359/328 |
| 4,867,956 | * | 9/1989 | Boryta et al. ....................... 423/277 |
| 5,104,845 | * | 4/1992 | Montag et al. ..................... 423/277 |
| 5,144,630 | * | 9/1992 | Lin ..................................... 372/22 |
| 5,191,587 | * | 3/1993 | Hanson et al. ...................... 372/21 |
| 5,381,754 | * | 1/1995 | Wu et al. ............................ 117/13 |
| 5,390,211 | * | 2/1995 | Clark et al. ......................... 372/95 |
| 5,684,813 | * | 11/1997 | Keszler ............................... 117/13 |
| 5,742,626 | * | 4/1998 | Mead et al. ......................... 372/22 |

OTHER PUBLICATIONS

Mori, et al, "Growth of a nonlinear . . . ," J. of Crys. Growth, 156, pp. 307–309, 1995, no month.*

Mori et al, "Nonlinear Optical Properties . . . ," Jpn. J. Appl. Phys. vol. 34, pp. L296–L298, Part 2, No. 3A, Mar., 1995.*

Tn, et al, "CsLiB6O10 : A Noncentrosymmetric Polyborate", Mat. Res. Bull., vol. 30, No. 2, pp. 209–215, 1995, Feb.*

Sasaki, et al., "New Nonlinear Optical Crystal Cesium Lithium Borate" OSA Proceedings on Advanced Solid State Lasers, vol. 24, pp. 91–95, Jan. 1995.*

* cited by examiner

*Primary Examiner*—Steven Bos
(74) *Attorney, Agent, or Firm*—Wenderoth, Lind & Ponack, L.L.P.

(57) ABSTRACT

The present invention provides a cesium-lithium-borate crystal, which can be used as a high-performance wavelength converting crystal, having a chemical composition expressed as $CsLiB_6O_{10}$, and substituted cesium-lithium-borate crystals expressed by the following formula:

$$Cs_{1-x}Li_{1-y}M_{x+y}B_6O_{10}$$

or $$Cs_{2(1-z)}Li_2L_zB_{12}O_{20}$$

(where, M is an alkali metal element, and L is an alkali earth metal element); a method for manufacturing same by heating and melting; and an optical apparatus using such crystals

20 Claims, 9 Drawing Sheets

$2\omega$  $4\omega$  $5\omega$

Figure : Type II phase-matching for OPG in CLBO

CESIUM-LITHIUM-BORATE CRYSTAL AND ITS APPLICATION TO FREQUENCY CONVERSION OF LASER LIGHT

BACKGROUND OF THE INVENTION

1. Field of the Invention

The present invention relates to a cesium-lithium-borate crystal and crystals with substituted chemical compositions thereof. More particularly, the present invention relates to a cesium-lithium-borate crystal and crystals with substituted chemical compositions thereof which are used as frequency converting nonlinear optical crystals in laser oscillators and optical parametric oscillators used in blue and ultraviolet lithography, laser microprocessing, scientific and industrial measurement and laser nuclear fusion, a method for manufacturing same, and an optical apparatus using same.

2. Prior Art and Problems

Laser oscillators used in ultraviolet lithography, laser microprocessing, scientific and industrial measurement and laser nuclear fusion must generate stable blue and ultraviolet rays efficiently. One of the methods to achieve the above object which is attracting the general attention to day is the method to efficiently obtain blue and ultraviolet rays by frequency conversion of a light source using nonlinear optical crystals.

A pulse YAG laser oscillator, a type of laser oscillators, for example, uses nonlinear optical crystals to convert frequency of a light source to generate the third (wavelength: 355 nm) or the fourth (wavelength: 266 nm) harmonics of the pulse YAG laser.

Many contrivances on the frequency converting none linear optical crystals which are indispensable for generating ultraviolet rays have been announced. For example, beta barium methaborate ($\beta$-$BaB_2O_4$), lithium triborate ($LiB_3O_5$), cesium triborate ($CsB_3O_5$) and other borate crystals are known. These frequency converting nonlinear optical crystals for generating blue and ultraviolet rays will pass wavelengths of 200 nm and below, and have a large nonlinear optical coefficient.

It is very difficult, however, to grow crystals of $\beta$-$BaB_2O_4$, one of such frequency converting nonlinear optinal crystals, because of the tendency of causing phase transition in the production process. Further, angular allowance is very tight, and thus this particular substance has a very low level of generality.

Furthermore, for $LiB_3O_5$ other frequency converting non-linear optical crystal, the growth time is very long as a result of flux growth in the production process, and this crystal is only good for phase matching for rays down to about 555 nm wavelengths for second harmonic generation. This crystal is used, for example, for generation of the third harmonic (wavelength: 355 nm) of Nd-YAG lasers, but cannot be used for generating the fourth harmonic (wavelength: 266 nm)

SUMMARY OF THE INVENTION

The present invention was developed to overcome the above-mentioned drawbacks of the prior art and has an object to provide a cesium-lithium-borate crystal and crystals with substituted chemical compositions which are high-performance frequency converting nonlinear optical crystals that pass shorter wavelengths, have a high conversion efficiency, and have a large temperature and angular allowance, a method for manufacturing such crystals, and a method for utilizing same.

As means to solve the above-mentioned problem, the present invention provides a cesium-lithium-borate crystal having a chemical composition expressed as $CsLiB_6O_{10}$.

The present invention provides also a substituted cesium-lithium-borate crystal having a chemical composition expressed by the following formula:

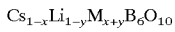

(where, M is at least one alkali metal element other than Cs and Li, and x and y satisfy the relationship of $0 \leq x \leq 1$ and $0 \leq y \leq 1$, and x and y never take simultaneously a value of 0 or 1), or the following formula

(where, L is at least one alkaline earth metal element, and $0 < z < 1$)

Furthermore, the present invention provides also a method for manufacturing the above-mentioned crystals by heating and melting a raw material mixture of constituent elements, a method for manufacturing the above-mentioned crystals through growth by the melt methods comprising the crystal pulling method and top seeded kyropoulos method, and a method for manufacturing the above-mentioned crystals through growth by the flux method.

The present invention furthermore provides a frequency converter and an optical parametric oscillator provided with the above cesium-lithium-borate crystal or the crystal With a substituted chemical composition as optical means.

DETAILED DESCRIPTION OF THE INVENTION

Figure 1:
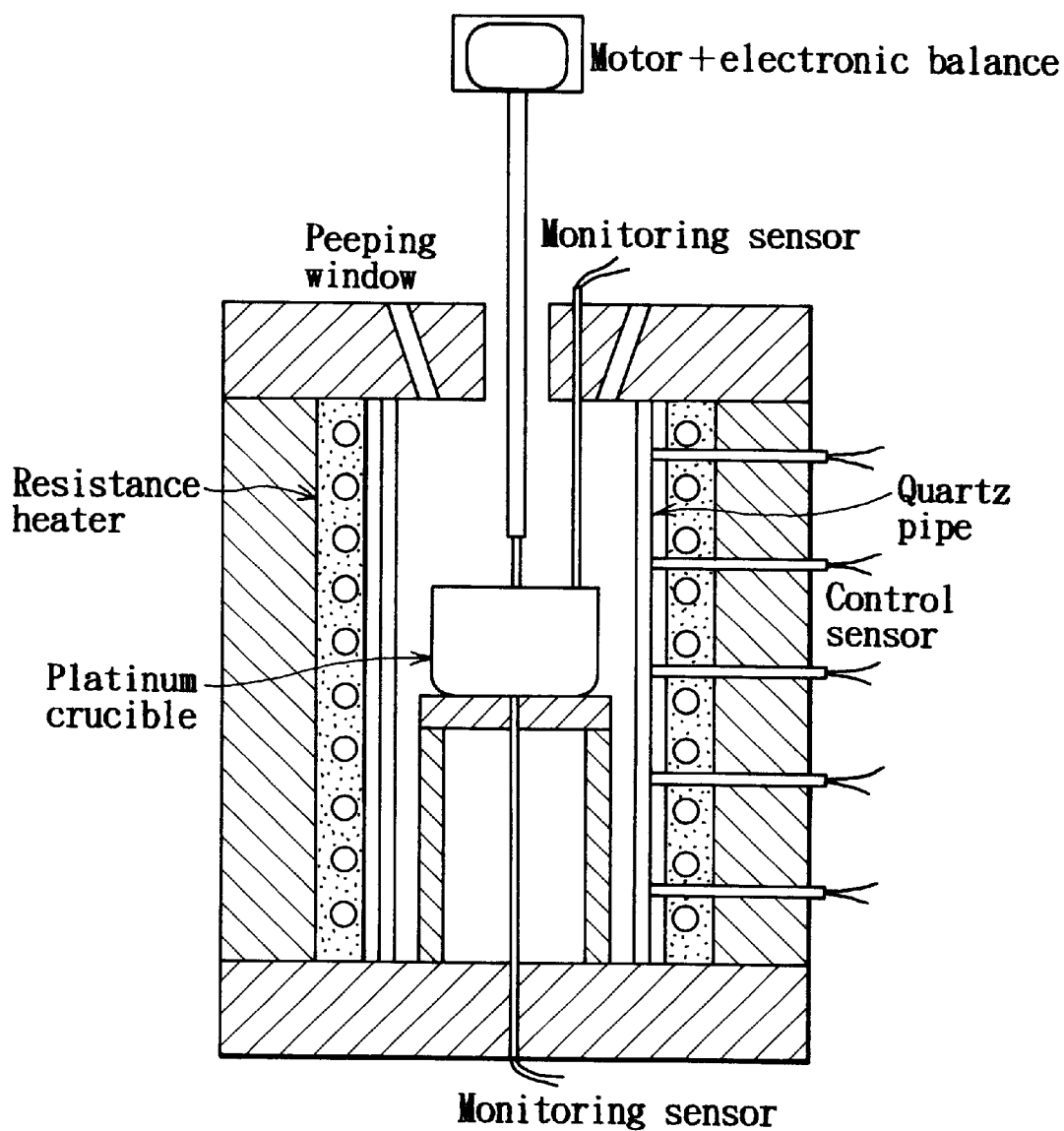
FIG. 1 shows a structural view illustrating an example of structure of a five-zone furnace for growing a cesium-lithium-borate crystal which is an embodiment of the present invention.

The present inventor noticed the fact that the borate crystals such as beta-barium methaborate ($\beta$-$BaB_2O_4$), lithium triborate ($LiB_3O_5$), and cesium triborate ($CsB_3O_5$), which are conventionally used as frequency converting nonlinear optical crystals for generating blue and ultraviolet rays, were generally borate crystals containing independent metals, and found that high-performance borate crystals never seen before can be realized by adding a plurality or kinds of metal ions.

The present inventor produced several kinds of borate crystals containing ions of two or more kinds of metals such as an alkali metal and an alkaline earth metal, and irradiated them with an Nd YAG laser (wavelength: 1,064 nm) to generate the second harmonic (wavelength: 532 nm) in order to find an optimum metal combination through a number of experimental verifications.

As a result, he has found that the borate crystals containing both Cs and Li, in particular, generate very strong second harmonic, and has developed totally new crystals including the cesium-lithium-borate crystal and crystals with substituted chemical compositions thereof of the present invention.

Prescribed crystals of the present invention are manufactured by beating and melting a mixture of raw materials such as cesium carbonate ($Cs_2CO_3$), lithium carbonate ($Li_2CO_3$) and boron oxide ($B_2O_3$). The reaction is expressed, for example, by the following formula:

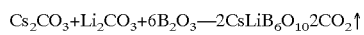

$Cs_2CO_3+Li_2CO_3+6B_2O_3 \rightarrow 2CsLiB_6O_{10}2CO_2\uparrow$ or

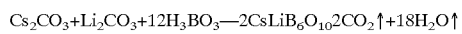

$Cs_2CO_3+Li_2CO_3+12H_3BO_3 \rightarrow 2CsLiB_6O_{10}2CO_2\uparrow+18H_2O\uparrow$ As a cesium-lithium-borate crystal substituted by an alkali metal element or an alkali earth metal element (M) other than Cs and Li, there is conceivable a crystal using an arbitrary alkali metal element other than Cs and Li, as expressed by the following formula:

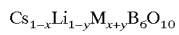

$Cs_{1-x}Li_{1-y}M_{x+y}B_6O_{10}$

Examples of composition include a composition with $0<x\leq 0.01$ when the alkali metal element (M) is Na (sodium), a composition with $0<x\leq 0.1$ when N is K (potassium), and a composition with $0<x\leq 1$ when M is Rb (rubidium) as being within a suitable range from the point of view of manufacture and physical properties. It is needless to mention that a plurality of alkali metal elements may be added.

By adding these alkali metal ions, it is possible to change the refractive index and phase matching angle, and to improve angular allowance and temperature allowance, and by simultaneously causing a structural change in crystal, a more stable crystal which is hard to crack and free from becoming white-muddy is available.

In the case of the following formula:

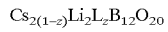

$Cs_{2(1-z)}Li_2L_zB_{12}O_{20}$

Ions of alkaline earth metals (L) such as Ba, Sr, Ca, Mg and Be are added. It is needless to mention that a plurality of alkaline earth metal elements may be added.

As in the case with alkali metals alone, addition of these alkaline earth metal ions permits changing the refractive index and the phase matching angle, and improvement of angular allowance and temperature allowance. At the same time, it is possible to obtain a more stable crystal by changing crystal structure.

In the present invention, the above-mentioned crystals can be used in frequency wave conversion or optical parametric oscillation (OPO). In other words, the present invention permits achievement of an optical apparatus provided with the above-mentioned crystals.

Now, the present invention will be described in further detail by means of examples. It is needless to mention that the present invention is not limited to the following examples.

EXAMPLE 1

Raw materials used were $Cs_2CO_3$, $Li_2CO_3$, and $B_2O_3$. These materials were mixed in a mol ratio of 1:1:6, and heated and melted to synthesize crystals. The melting point of the crystal was 846° C.

There was obtained a transparent crystal measuring 30×25×25 mm after approximately two weeks' growth period using the top seed method and temperature decrease, method to grow the crystal from the melt.

The chemical structural formula of the crystal obtained is $CsLiB_6O_{10}$ according to the result of compsitional analysis such as ICP emission spectral analysis and ICP mass spectroscopy. Measurement of the melting point through a differential thermal analysis revealed a melting point of 846° C. of this cesium-lithium-borate crystal. This crystal belongs to tetragonal system (space group I42d) according to the result of an X-ray structural analysis. Further, this cesium-lithium-borate crystal is transparent for the visible radiations, and it passes light of wavelengths down to 180 nm.

The effective second-order nonlinear optical constant was $d_{eff}=4d_{KDP}$ according to the result of analysis by the powder method.

Further, a part of this cesium-lithium-borate crystal measuring 30×25×25 mm was cut by the angle of phase matching, and polished. The polished crystal was then irradiated by 1.06 $\mu$m neodymium YAG laser light. Green rays of 0.53 $\mu$m wavelength (the second harmonic), was obtained efficiently.

A cesium-lithium-borate crystal measuring 10 diameter× 20 mm was grown by the revolving pull-up method (rate of revolution: 10 rpm; pull-up rate.: 0.5 mm/h). This was confirmed to be the same as that described above.

EXAMPLE 2

A cesium-lithium-borate crystal ($CsLiB_6O_{10}$) comprising a stoichiometric chemical composition was manufactured by heating and melting a mixture of cesium carbonate ($Cs_2CO_3$), lithium carbonate ($Li_2CO_3$) and boron oxide ($B_2O_3$) and the resultant cesium-lithium-borate crystal was grown by the top seeded kyropoulos method in a five-zone furnace. FIG. 1 shows the structure of the five-layer controlled growing furnace used for growing the crystal. This five-layer controlled grossing furnace has a structure in which a cylindrical platinum crucible is installed in an upright five-stage resistance heating furnace capable of keeping a uniform temperature in the furnace. The seed crystal of $CsLiB_6O_{10}$ was attached to a platinum rod. The growing crystal was rotated at a rate of 15 rpm with inverting the rotation direction in every three minutes. Temperature in the platinum crucible was kept at 848° C., the melting point of the crystal. This permitted growth of a transparent and high-quality cesium-lithium-borate crystal, measuring 2.9 cm×2.0 cm×2.2 cm, free from cracks in about four days. This represents a very short period of growth as compared with the conventional growth of a nonlinear optical borate crystal for frequency conversion. It is thus possible to easily grow a cesium-lithium-borate crystal in a very short period of time for growth by the application of the growing method of the cesium-lithium-borate crystal of the present invention.

Figure 2:
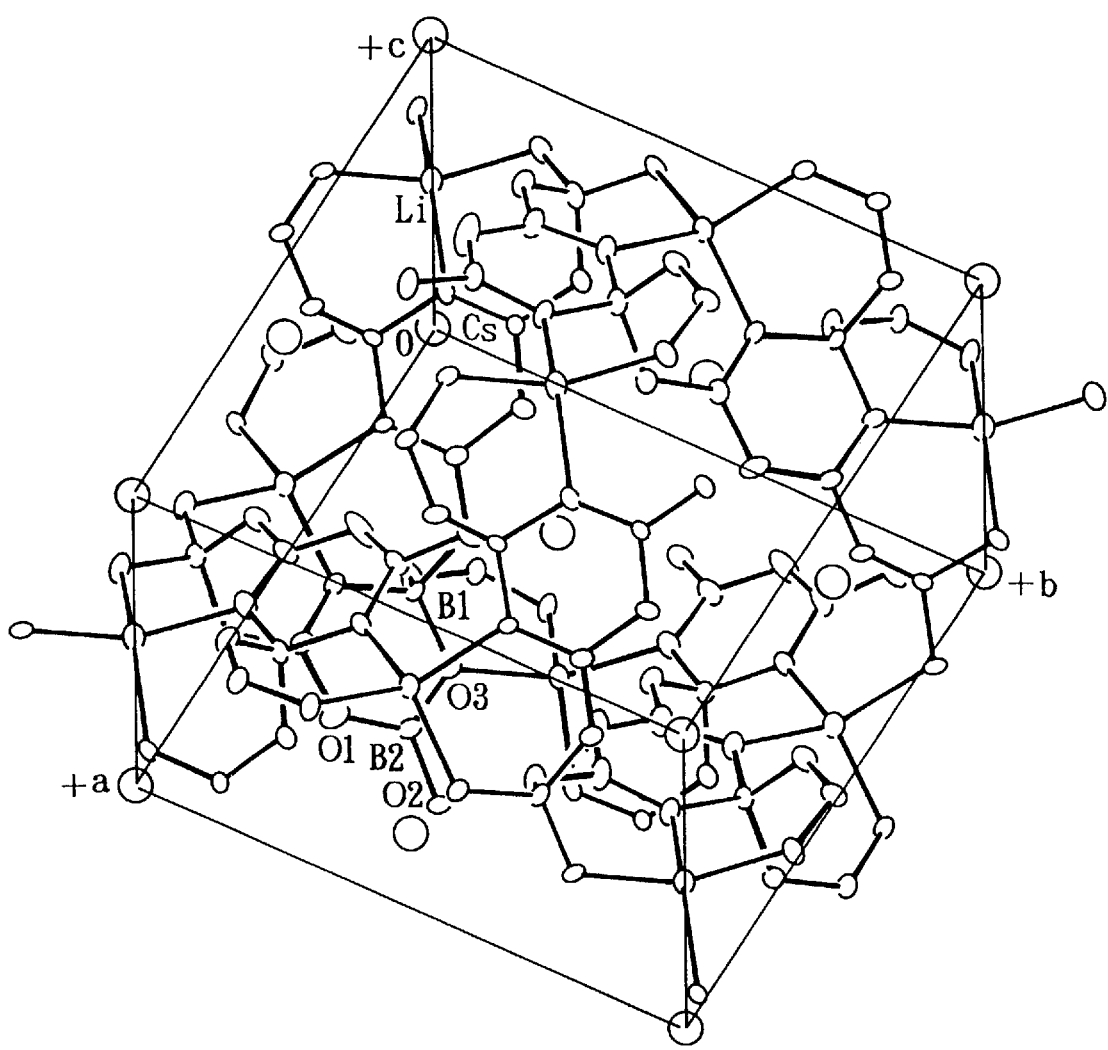
FIG. 2 shows a three-dimensional structural diagram illustrating the structure of the cesium-lithium-borate crystal of the present invention.

According to the result of crystal structural analysis by means of a Rigaku AFC5R X-ray diffraction apparatus, the cesium-lithium-borate crystal was a tetragonal crystal belonging to the space group I42d symmetrical group, with a crystal lattice constant of a=10,494 and c=8,939 Å, and a calculated density of 2.461 g/cm³. FIG. 2 shows the three-dimensional structure of this cesium-lithium-borate crystal, which suggests a structure in which a cesium atom is present in a channel of borate ring comprising boron and oxygen. It is clear that this crystal has a structure quite different from that of $LiB_3O_5$ or $CsB_3O_5$ (both are or the rhombic), nonlinear optical crystal so far commonly used.

Figure 3:
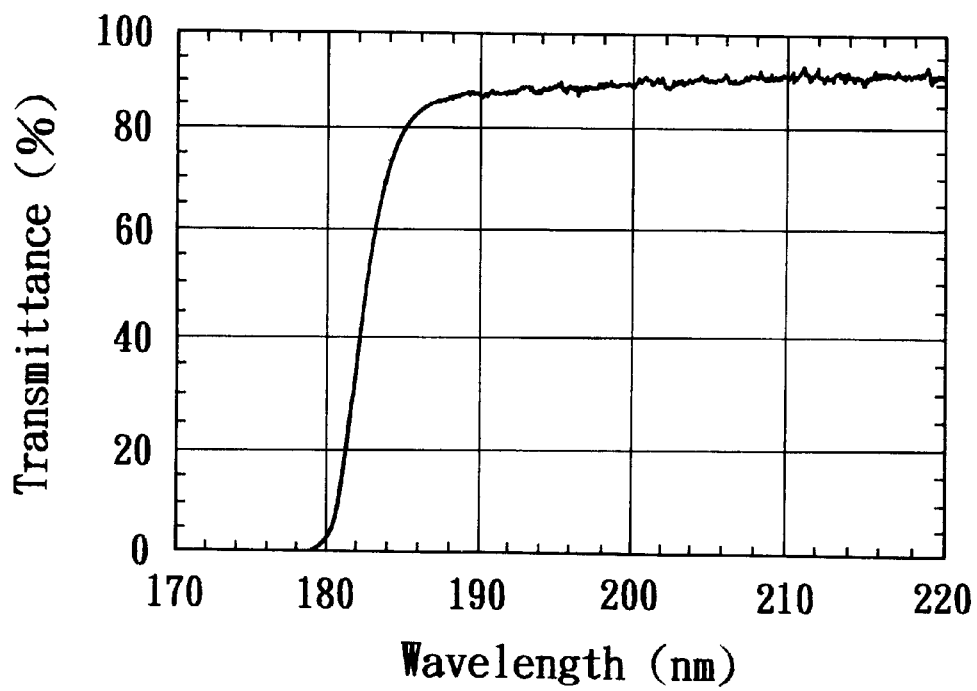
FIG. 3 shows a graph illustrating transmission spectrum of the cesium-lithium-borate crystal of the present invention.

This cesium-lithium-borate crystal was transparent relative to a light having a wavelength of from 180 nm to 2750 nm, according to the result oI measurement of transmission spectra. FIG. 3 shows the transmission spectrum in the short wavelength region. As is clear from FIG. 3, the crystal had an absorption edge of 180 nm which was shorter by about 9 nm than that of the conventional β-$B_aB_2O_4$ (189 nm).

Figure 4:
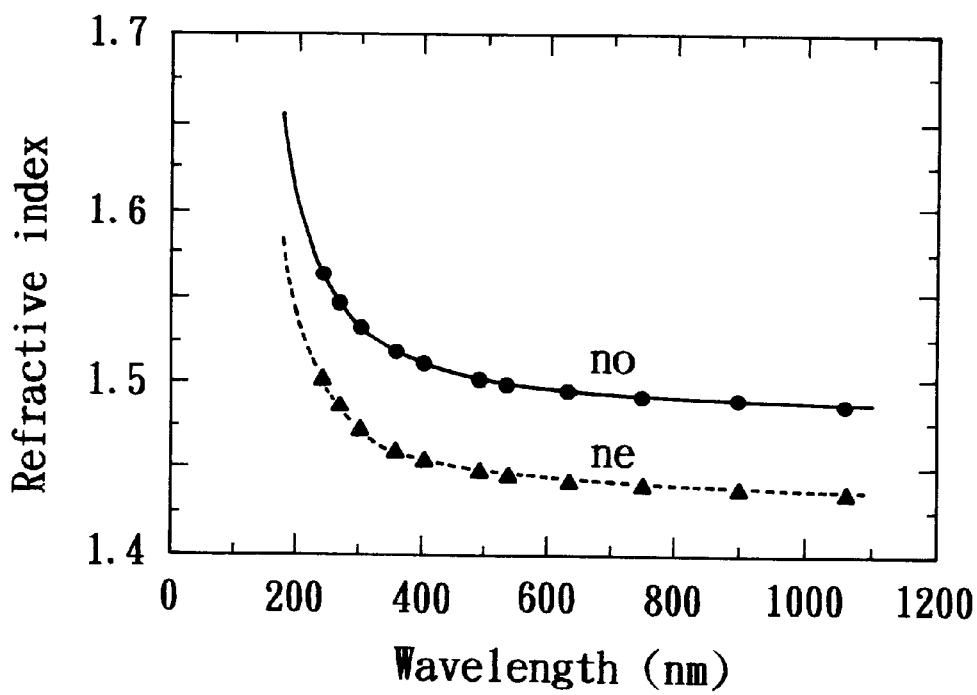
FIG. 4 shows a graph illustrating the refractive index dispersion curve for the cesium-lithium-borate crystal of the present invention.

The refractive index of this cesium-lithium-borate crystal was measured by the prism method within a wavelength range of from 240 nm to 1,064 nm. FIG. 4 shows a dispersion curve of the refractive index. In FIG. 4, "$n_o$" represents the refractive index for the normal light, and "$n_e$" indicates that for an abnormal light.

The approximation formula of refractive index (Sellmeier's equation) as available from this refractive index dispersion curve is as follows;

$$n_o^2 = 2.19974 + \frac{1.18388 \times 10^{-2}}{\lambda^2 - 8.77048 \times 10^{-3}} - 8.52469 \times 10^{-5}\lambda^2$$

$$n_e^2 = 2.05386 + \frac{9.4403 \times 10^{-3}}{\lambda^2 - 8.62428 \times 10^3} - 7.82600 \times 10^{-5}\lambda^2$$

EXAMPLE 3

Figure 5:
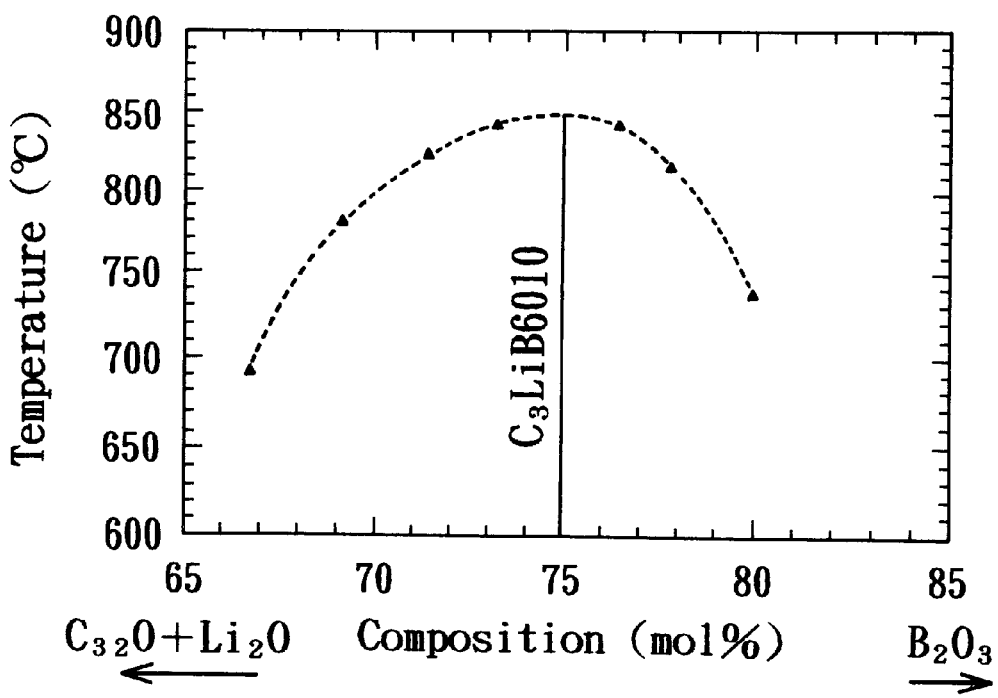
FIG. 5 shows a relational diagram illustrating the relationship between the mixing ratio of boron oxide ($B_2O_3$) and temperature during manufacture of the cesium-lithium-borate crystal of the present invention.

The relationship between the mixing ratio of $B_2O_3$ and temperature upon manufacture of this cesium-lithium-borate crystal was determined. The mixing ratio of $B_2O_3$ was varied within a range of from 66.7% to 83.3% while keeping a constant mixing ratio of 1:1 between the initial raw materials $Cs_2CO_3$ and $Li_2CO_3$, and the melting point of the crystal was determined by placing a sintered powder of the resultant mixture into a differential thermal analyzer. FIG. 5 is a graph illustrating the relationship between the mixing ratio of $B_2O_3$ and temperature in this case. In FIG. 5, $Cs_2CO_3$ and $Li_2CO_3$ mixed at a ratio of 1:1 are represented by $Cs_2O$ $Li_2O$. As is evident from FIG. 5, a $CsLiB_6O_{10}$ crystal was stably available with a mixing ratio of $B_2O_3$ within a range of from 66.7% to 81.8%. With a mixing ratio of $B_2O_3$ of under 66.7% CBO precipitated along with $CsLiB_6O_{10}$ crystal, and with a mixing ratio within a range of from 81.8 to 83.8%, unknown crystals other than $CsLiB_6O_{10}$ crystal precipitated simultaneously, thus resulting in unstable manufacture of the crystal. In the manufacture of this cesium-lithium-borate crystal, therefore, the mixing ratio of $B_2O_3$, an initial raw material, should preferably be kept within a range of from 66.7% to 81.8%. The $CsLiB_6O_{10}$ crystal stably manufactured can melt congruently at 848° C.

Since this cesium-lithium-borate crystal is a congruently melting crystal, it is possible to grow a high-quality crystal with a constant composition easily within a short period of time through adoption of the Top-seeded kyropoulos method, crystal pulling method or the flux method, as compared with the conventional β-$BaB_2O_4$ tending to easily cause phase transition during growth from the melt and $LiB_3O_5$ requiring a long growth period for flux growth.

EXAMPLE 4

A cesium-lithium-borate crystal was manufactured by heating and melting 12 kg mixture of cesium carbonate ($Cs_2CO_3$), lithium carbonate ($Li_2CO_3$) and boron oxide ($B_2O_3$) mixed at a ratio of 1:1:5.5 ($B_2O_3$ accounting for 73.3%). The resultant cesium-lithium-borate crystal was largely grown by the flux method in a five-zone furnace. As large crystal growth requires a large temperature drop, the flux method is suitable. For the purpose of growing a large crystal, a large platinum crucible having a diameter of 20 cm and a height of 20 cm was employed. In this Example, the growth saturation temperature was measured to be 845° C. The crystal was grown by reducing the growing temperature from 845° C. to 843.5° C. at a daily rate of about 0.1° C. A large transparent crystal measuring 13 cm×12 cm×10 cm and weighing about 1.6 kg could be grown in about 12 days. In this crystal growth, there was no unstable growth such as hopper growth observed in the conventional growth of $LiB_3O_5$ crystal, proving a very stable growth.

EXAMPLE 5

By using the cesium-lithium-borate crystal ($CsLiB_6O_{10}$) of the present invention as a frequency converting nonlinear optical crystal of an Nd:YAG laser, the second harmonic (SHG: wavelength: 532 nm) of the Nd:YAG laser (wavelength: 1,064 nm) was generated.

Figure 6:
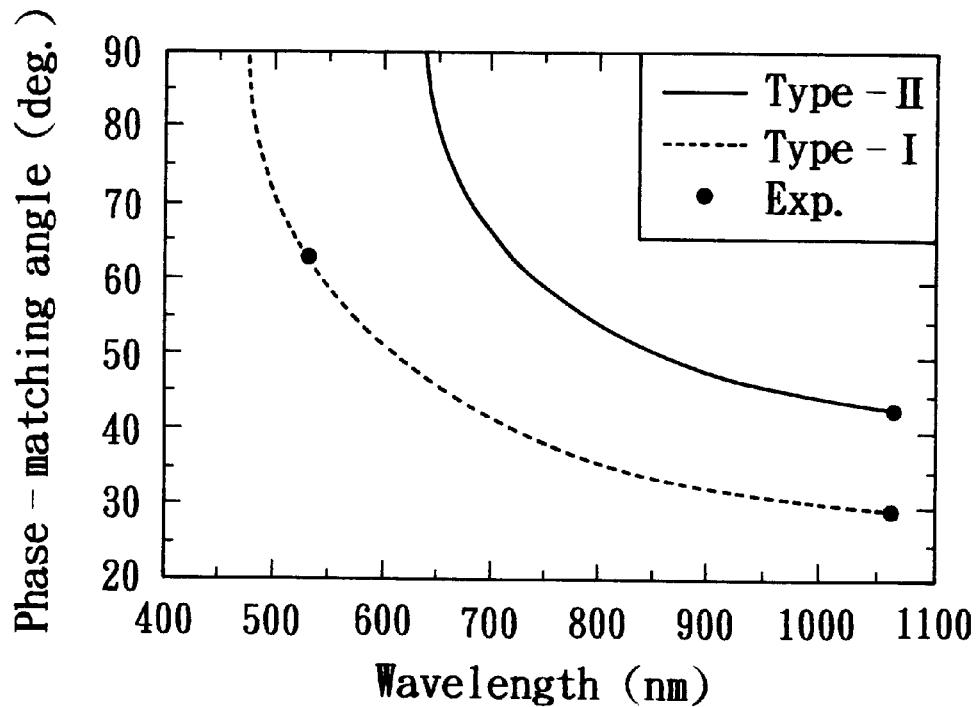
FIG. 6 shows a graph illustrating the relationship between the phase matching angle $\theta$ and the incident laser wavelength of a crystal capable of generating the second harmonic (SHG) in Nd:YAG laser with the cesium-lithium-borate crystal which is an embodiment of the present invention.

FIG. 6 illustrates the relationship between the phase matching angle θ of the crystal permitting second harmonic generation (SHC) and the input laser wavelength. In FIG. 6, the dotted line represents the calculated values based on Sellmeier's equation for Type-I SHG, the solid line, the calculated values for Type-II SHG by Sellmeier's equation, and the black plots are observed values. The limit of SHG wavelength is 477 nm in Type-I, and 640 nm in Type-II. As is clear from FIG. 6, for example, the Type-I SHG of Nd:TAG laser beam having a wavelength of 1,064 nm shows an incident angle of 29.6° in calculation and about 30° in observation. The Type-I SHG of Nd:YAG laser beam having a wavelength of 532 nm gives an incident angle of 62.5° in calculation and 62° in observation. There is suggested a satisfactory agreement.

Figure 7:
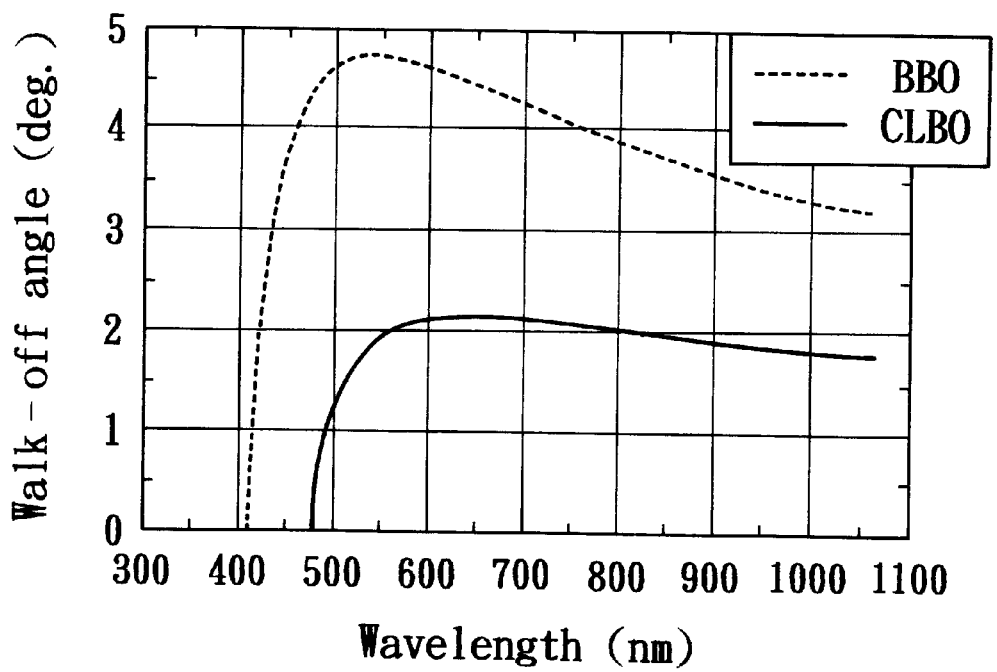
FIG. 7 shows a graph illustrating the relationship between the walk-off angle and the incident laser wavelength in Nd:YAG laser of a cesium-lithium-borate crystal which is an embodiment of the present invention.

FIG. 7 is a graph illustrating the relationship between the walk-off angle and the wavelength for Type-I SHG obtained through calculation from Sellmeier's equation. In FIG. 7, the solid line represents $CsLiB_6O_{10}$ of the present invention, and the dotted line, the conventional $\beta$-$BaB_2O_4$.

Table 1 shows, for $CsLiB_6O_{10}$ of the present invention and the conventional $\beta$-$BaB_2O_4$ Type-I SHG, with an incident wavelengths of 1,064 μm and 532 nm, calculated values of phase matching angle θ, effective nonlinear optical coefficient $d_{eff}$, angular allowance Δθ.L, spectral allowance Δλ.L, temperature allowance ΔT.L, walk-off angle, and laser damage threshold value. As to the refractive index for $\beta$-$BaB_2O_4$ necessary for calculating these values, those in literature released in "J. Appl. Phys. Vol. 62, D. Eimerl, L, Davis, S. Velsto, B. K. Graham and A. Zalkin (1987), p. 1968."

The effective nonlinear optical constant deff was derived from comparison with SHG of $KH_2PO_4$ (KDP) crystal. $CsLiB_6O_{10}$ has a crystal structure identical with that of KDP.

The second-order nonlinear optical coefficient is expressed as $d_{36}$, where $d_{36}$(CLBO)=2.2×$d_{36}$(KDP)=0.95 pm/r, and its relationship with $d_{eff}$ is $d_{eff}$=−$d_{36}$ sin θ sin 2ϕ. The value of $d_{eff}$ was calculated by means of this formula. A value of 0.435 pm/V was used as the standard value of $d_{36}$ of KDP.

The angular allowance Δθ.L and the spectral allowance Δλ.L were calculated in accordance with Sellmeier's equation.

Figure 8:
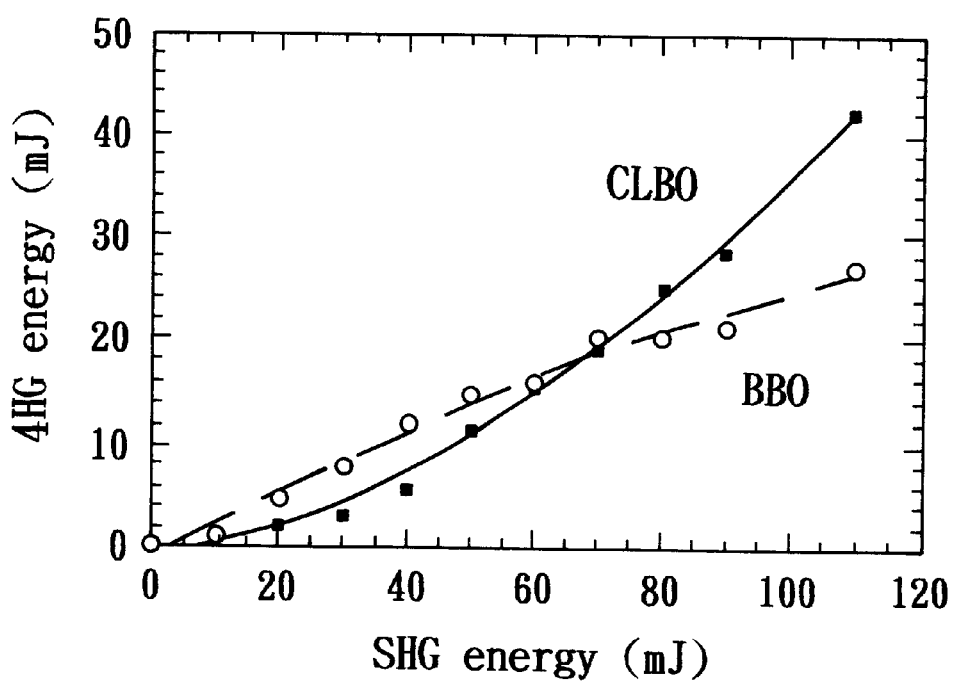
FIG. 8 shows a graph illustrating the fourth harmonic generating characteristics of a cesium-lithium-borate crystal which is an embodiment of the present invention.

The temperature allowance ΔT.L, which could not be obtained from calculation, was actually measured within a range of from 20° C. to 150° C.

graph illustrating the relationship between the energy output of the incident light SHG and the energy output of 4HG, i.e., generation characteristics of the fourth harmonic. In FIG. 8, the solid line represents the $CsLiB_6O_{10}$ of the present invention, and the dotted line indicates $\beta$-$BaB_2O_4$. The sample length was 9 mm for $CsLiB_6O_{10}$ and 7 mm for $\beta$-$BaB_2O_4$. As is evident from FIG. 8, according as the energy of the incident light SHG becomes larger, $\beta$-$BaB_2O_4$'s 4HG energy shows a tendency toward saturation, whereas $CsLiB_6O_{10}$ of the invention is proportional to the square of the incident energy, and in the high incident energy region with a high energy of incident light, a 4HG output energy larger than that of $\beta$-$BaB_2O_4$ is available. The cesium-lithium-borate crystal of the present invention can therefore be used as a very excellent wavelength converting nonlinear optical crystal capable of generating ultraviolet rays of a high output energy.

EXAMPLE 7

The fifth harmonic (5HG; wavelength: 213 nm) of Nd:YAG laser (wavelength: 1,064 nm) was generated by using the cesium-lithium-borate crystal ($CsLiB_6O_{10}$) of the present invention in the Nd:YAG laser.

Figure 9:
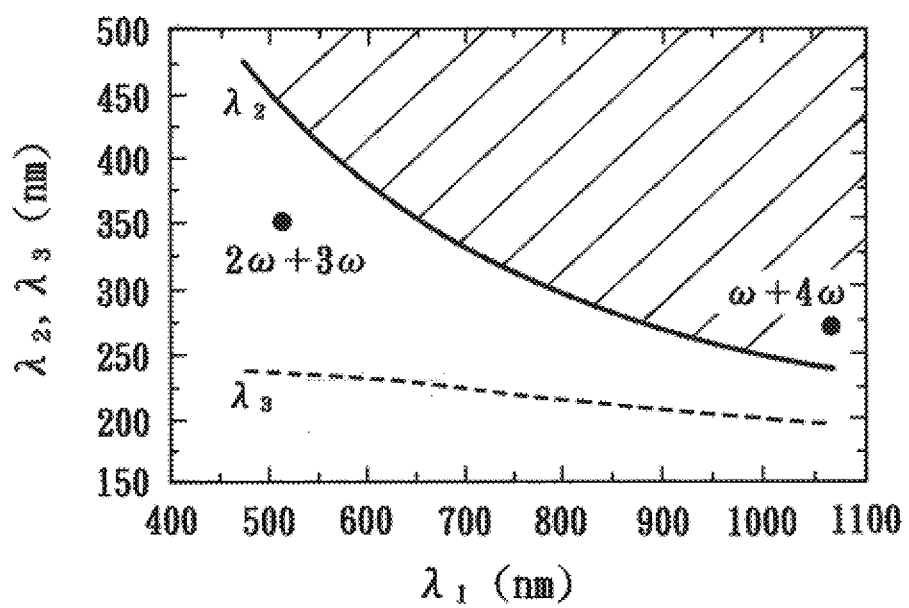
FIG. 9 shows a graph illustrating a theoretical curve of non-critical phase matching wavelength resulting from generation of a sum frequency, and wavelength of the resultant sum frequency for a cesium-lithium-borate crystal which is an embodiment of the present invention.

FIG. 9 is a graph illustrating the results of calculation of a frequency capable of generating a sum frequency ($\omega_1$+$\omega_2$=$\omega_3$) of two frequencies ($\omega_1$ and $\omega_2$) in $CsLiB_6O_{10}$ of the invention, as derived from Sellmeir's equation. The abscissa represents the light wavelength $\lambda_1$ corresponding to the frequency $\omega_1$, and the ordinate represents the light wavelength $\lambda_2$ corresponding to the frequency $\omega_2$ and the light wavelength $\omega_3$ corresponding to the frequency $\omega_3$. In FIG. 9, the region shadowed with oblique lines above the solid line is the region in which a sum frequency can be generated. The dotted line represents the wavelength $\lambda_3$ available as a result of a sum frequency. For example, assuming that an

TABLE 1

| Fundamental wavelength (nm) | Crystal | Phase-matching angle (θ) | $d_{eff}$ (pm/V) | Δθl (mrad-cm) | Δλl (nm-cm) | ΔTl (° C.-cm) | Walk-off angle (deg) | Damage threshold (GW/cm²) |
|---|---|---|---|---|---|---|---|---|
| 1064 | CLBO | 29.6 | 0.47 | 1.02 | 7.03 | | 1.78 | 26 |
| | BBO | 21 | 2.06 | 0.51 | 2.11 | | 3.20 | 13.5 |
| 532 | CLBO | 62.5 | 1.01 | 0.49 | 0.13 | 9.4 | 1.83 | |
| | BBO | 48 | 1.85 | 0.17 | 0.07 | 4.5 | 4.80 | |
| 488 | CLBO | 77.9 | 1.16 | 0.84 | 0.09 | | 0.98 | |
| | BBO | | 1.88 | 0.16 | 0.05 | | 4.66 | |

As is clear from Table 1, the $CsLiB_6O_{10}$ of the present invention has a smaller effective nonlinear optical constant as compared with the conventional BBO. The $CsLiB_6O_{10}$ of the invention is however larger in angular allowance, wavelength allowance and temperature allowance and smaller in walk-off angle. The cesium-lithium-borate crystal of the present invention therefore permits more effective frequency conversion than that with the conventional nonlinear optical crystal.

EXAMPLE 6

The fourth harmonic (4HG; wavelength: 266 nm) of Nd:YAG laser (wavelength: 1,064 nm) was generated by using the cesium-lithium-borate crystal ($CsLiB_6O_{10}$) of the present invention in Nd:YAG laser. The second harmonic (SHG) of Q-switch laser having a pulse width of 8 nanoseconds was employed as the incident light with a beam diameter of 4 mm and repetition rate at 10 Hz. FIG. 8 is a Nd:YAG laser has a basic wave (wavelength: 1,064 nm) ω, then ω+4ω=5ω is possible. In other words, the fifth harmonic can be generated by the sum frequency of the basic wave and the fourth harmonic. Generation or the fifth harmonic by adding the second and third harmonics is however impossible.

In FIG. 9, the black plots represent the wavelength available from sum frequency of ω+4ω and that available from sum frequency of 2ω+3ω. Presence of only black plots representing ω+4ω in the slashed region reveals that the fifth harmonic can be generated only from the sum frequency of ω+4ω. As is evident from the dotted line (wavelength: $\lambda_3$) in FIG. 9, a wavelength of even under 200 nm can be generated from a sum frequency by properly selecting wavelengths $\lambda_1$ and $\lambda_2$.

Figure 10:
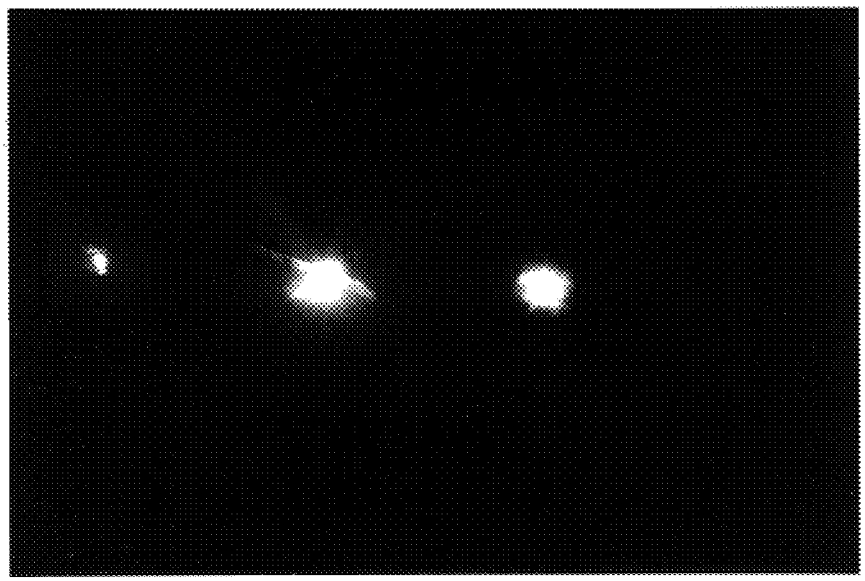
FIG. 10 is a photograph taking the place of a drawing of the fifth harmonic, and the second and fourth harmonics of Nd:YAG laser available by the generation of sum frequency for a cesium-lithium-borate crystal which is an embodiment of the present invention.
Figure 11:
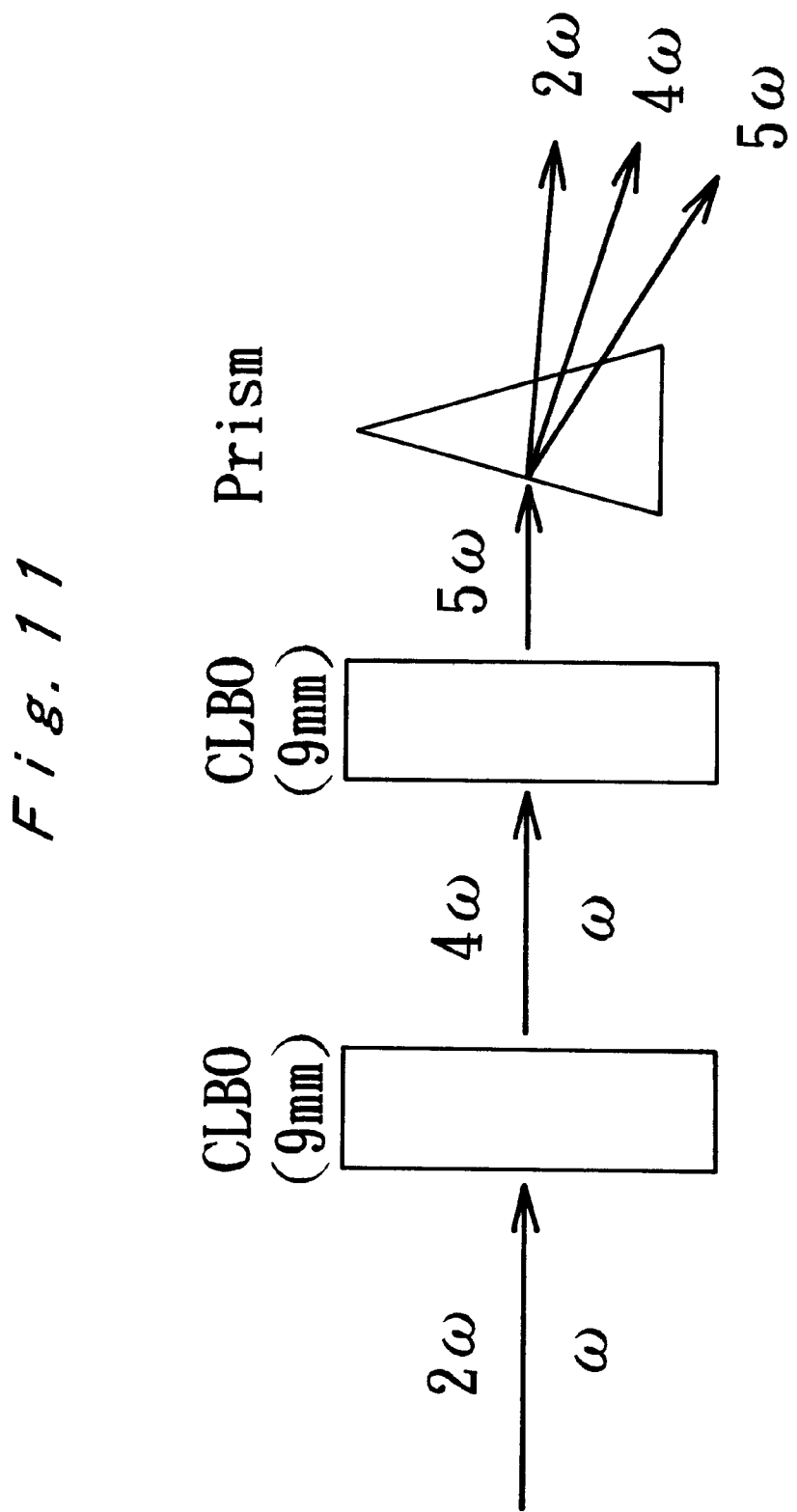
FIG. 11 shows a schematic representation of the beam pattern of the fifth harmonic, and the second and fourth harmonics of Nd:YAG laser available by the generation of sum frequency for a cesium-lithium-borate crystal which is a embodiment of the present invention.

FIG. 10 illustrates a photograph of the beam pattern of the fifth harmonic of Nd:YAG laser generated with $CsLiB_6O_{10}$ of the present invention. FIG. 11 is a schematic view of crystal arrangement upon generation of the second harmonic, the fourth harmonic and the fifth harmonic in this case Table 2 shows energy values of the individual frequencies of $CsLiB_6O_{10}$ (LLBO) of the invention and the conventional $\beta$-$BaB_2O_4$(BBO). As is clear from Table 2, while 5$\omega$ available from the conventional $\beta$-$BaB_2O_4$(BBO) is 20 mJ, what is available from $CsLiB_6O_{10}$ of the invention is a higher output of 35 mJ. The cesium-lithium-borate crystal of the present invention can therefore generate the fifth harmonic of a higher output than the conventional $\beta$-$BaB_2O_4$, and can be used as a nonlinear optical crystal for generating a very excellent fifth harmonic. The beam pattern obtained from FIG. 10 is closest to circle, suggesting that it is possible to generate second harmonics throughout the entire beam. This is attributable to a larger angular allowance $\Delta\theta.L$ and temperature allowance $\Delta T.L$ of CLBO than BBO.

TABLE 2

| Harmonic | 2$\omega$ | 4$\omega$ | 5$\omega$ | Crystal |
|---|---|---|---|---|
| Power (mJ) | 350 | 110 | 35 | CLBO |
| Power (mJ) | 500 | 80 | 20 | BBO |

EXAMPLE 8

The output of wavelength of 488 nm of Ar laser was converted into a second harmonic by means of the cesium-lithium-borate crystal of the present invention. Table 1 presented above shows, for the $CsLiB_6O_{10}$ of the invention and the conventional $\beta$-$BaB_2O_4$ relative to Type-I SHG with an incident wavelength of 488 nm, calculated values of phase matching angle $\theta$, effective nonlinear optical coefficient $d_{eff}$, angular allowance $\Delta\theta.L$, spectral allowance $\Delta\lambda.L$, and walk-off angle. The same calculating methods as in the Example 5 were used for these calculations. As is clear from Table 1, $CsLiB_6O_{10}$ has a walk-off angle of 0.98° which is very close to the noncritical phasematching. This demonstrates that the cesium-lithium-borate crystal of the invention gives a very high conversion efficiency as compared with the conventional $\beta$-$BaB_2O_4$.

EXAMPLE 9

The cesium-lithium-borate crystal of the present invention was used for optical parametric oscillation (OPO).

Optical parametric oscillation (OPO) is a process of wavelength conversion comprising exciting a nonlinear polarization within a nonlinear optical crystal with a laser beam, thereby dividing the energy of the excited beam through nonlinear oscillation of polarized electrons into a signal light and an idler light.

Figure 12:
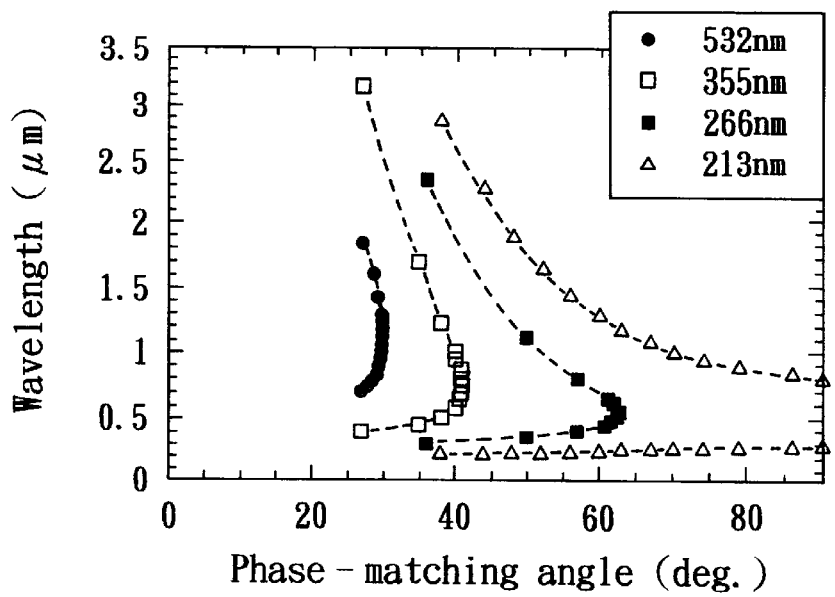
FIG. 12 shows a graph illustrating the phase matching tuning curve of Type-I OPO using a cesium-lithium-borate crystal which is an embodiment of the present invention with wavelengths of the excited light of 213 nm, 266 nm, 355 nm and 532 nm.
Figure 13:
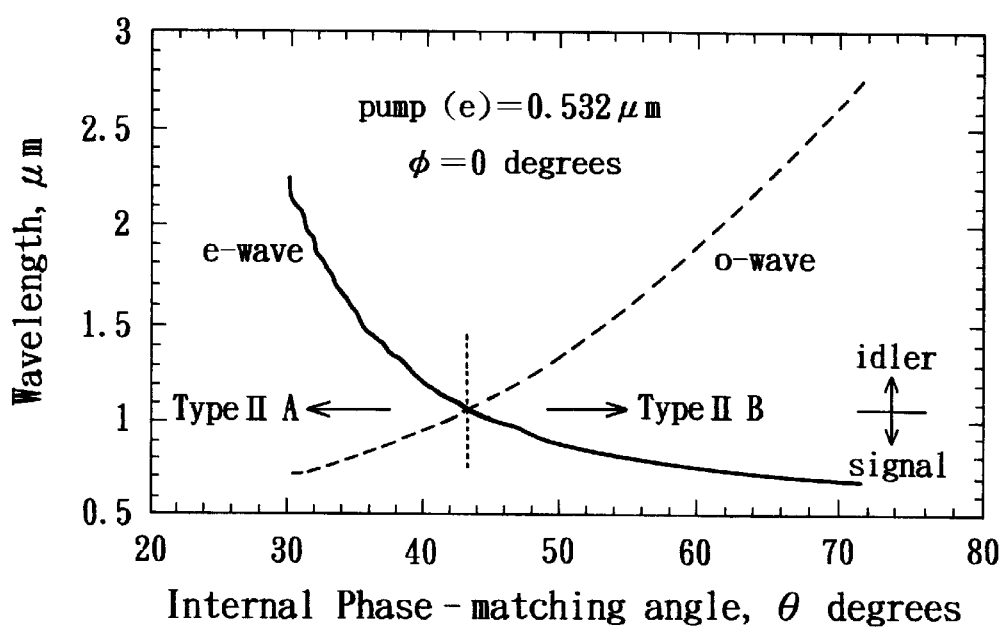
FIG. 13 shows a A graph illustrating the phase matching tuning carve of Type-II OPO using a cesium-lithium-borate crystal which is an embodiment of the present invention with a wavelength of the excited light of 532 nm.

Because of the possibility to tune a wavelength region within a wide range, a wider application of OPO is expected. The cesium-lithium-borate crystal of the invention, having a relatively large effective nonlinear optical coefficient, can supply a longer crystal length, because of the lasiness of growing a longer crystal, and further to a larger power density of the excited beam because of the high laser damage threshold value, thus providing excellent characteristics as an OPO crystal FIG. 12 is a phase matching tuning curve diagram illustrating the relationship between the wavelengths of the signal light produced in Type-I With excited light wavelengths of 213 nm, 266 nm, 355 nm and 532 nm, and the corresponding phase matching angles. FIG. 13 is a phase matching tuning curve diagram illustrating the relationship between the wavelength of the signal light produced in Type-II with a wavelength of the excited light of 532 nm and the corresponding phase matching angle. As is clear from FIGS. 12 and 13, the cesium-lithium-borate crystal of the present invention exhibits excellent properties also as an OPO crystal.

Particularly OPO based on excitation with the fourth harmonic (wavelength: 266 nm) of Nd:YAG laser gives a variable-wavelength laser beam near 300 nm. This has been impossible in the conventional $\beta$-$BaB_2O_4$ because of the small angular allowance $\Delta\theta.L$ and the large walk-off.

EXAMPLE 10

An Rb (rubidium)-substituted cesium-lithium-borate crystal $Cs_{1-x}LiRb_xB_6O_{10}$ was manufactured in the same manner as in the Example 2.

Figure 14:
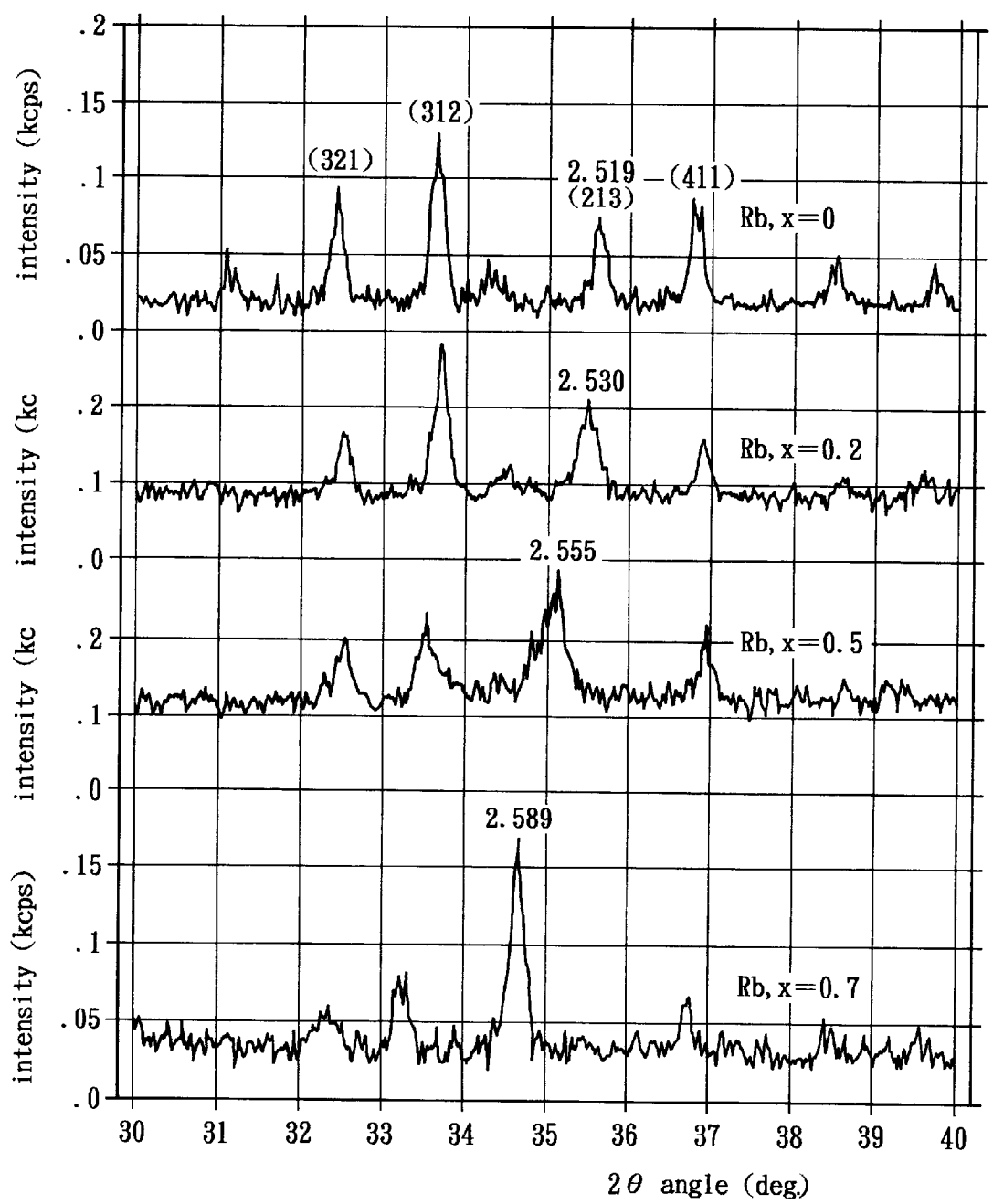
FIG. 14 shows a graph illustrating power X-ray diffraction data regarding $Cs_{1-x}LiRb_xB_6O_{10}$ crystal.

According to the results of evaluation of the resultant crystal by the powder X-ray diffraction method, as shown in FIG. 14, particularly, the interval between reflection peak of (312) plane and reflection peak of (213) plane becomes gradually arrower by sequentially increasing the amount of added Rb from x=0.2, to 0.5 and then 0.7 to the X-ray diffraction pattern of the sample (Rb, X=0) not added with Rb. This shows that Cs and Rb enter into the crystal at an arbitrary ratio. The crystal added with Rb arbitrarily is the same tetragonal crystal as CLBO not added with Rb, and the lattice constant varies accordingly.

Since it is possible to add Rb ions in an arbitrary amount, it is possible to change the refractive index of the crystal, and this reveals the possibility to improve the phase matching angle, angular allowance and temperature allowance.

Similarly, crystals with amounts (x) of added Rb of under 0.1 were manufactured. It was confirmed as a result that the stability of crystal structure vias morg satisfactory.

EXAMPLE 11

Crystals were manufactured in the same manner as in the Example 10 except that K or Na was added in place of Rb. Availability of high-quality crystals was confirmed with a constituent ratio (x) of under 0.1 for $\kappa$ (potassium), and under 0.01 for Na (sodium).

Crystals in which K or Na was coexistent with Rb were also manufactured. In this case, in a composition:

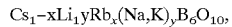

$Cs_1-xLi_1yRb_x(Na,K)_yB_6O_{10}$, a more stable crystal was obtained with $0<x\leq 1$ and $0<y<0.1$.

EXAMPLE 12

Crystals were manufactured in the same manner as in the Example 10 except that an alkaline earth metal element was added in place of an alkali metal.

For example, in the case of a composition $Cs_{2(1-z)}Li_2Ba_zB_{12}O_{20}$ it was confirmed that a stable crystal is available with $0<z\leq 0.1$.

According to the present invention, as described above in detail a novel cesium-lithium-borate crystal and substituted cesium-lithlium-borate crystals are provided. These crystals permit conversion of frequency, has a high converting efficiency, and wide temperature allowance and angular allowance, and can be used as a high-performance frequency converting crystal. Furthermore, the $CsLiB_6O_{10}$ crystal has a low melting point of 848° C., and because of the congruency of $CsLiB_6O_{10}$ crystal, it is possible to easily grow a large high-quality crystal having a stable composition by the application of the melt methods based on the Top-seeded kilgpoulos method, crystal pulling method or the flux method.

What is claimed is:

1. A cesium-lithium-borate crystal having a chemical composition consisting of $CsLiB_6O_{10}$.

2. A method for manufacturing a crystal as claimed in claim 1, which comprises forming a mixture comprising a source of Cs, Li, B and O, and heating and melting the mixture to a temperature sufficient to form said crystal.

3. The method for manufacturing a crystal according to claim 2, which comprises a step of growing the crystal by the melt method.

4. The method for manufacturing a crystal according to claim 2, which comprises a step of growing the crystal by the flux method.

5. A cesium-lithium-borate crystal having a chemical composition consisting of $Cs_{1-x}Li_{1-y}M_{x+y}B_6O_{10}$ wherein M is at least one alkali metal element other than Cs and Li, and wherein x and y satisfy the relationship of $0<x<1$ and $0<y<1$.

6. The crystal according to claim 5, wherein M is at least one alkali metal element selected from the group consisting of Na, K and Rb.

7. A method for manufacturing a crystal as claimed in claim 5, which comprises forming a mixture comprising a source of Cs, Li, B, O, and M, wherein M has the same meaning as defined in claim 5, and heating and melting the mixture to a temperature sufficient to form said crystal.

8. The method for manufacturing a crystal according to claim 7, which comprises a step of growing the crystal by the melt method.

9. The method for manufacturing a crystal according to claim 7, which comprises a step of growing the crystal by the flux method.

10. A frequency converting apparatus which contains a crystal according to claim 5.

11. The apparatus according to claim 10, which generates a second, third, fourth or fifth harmonic of a laser.

12. An optical parametric oscillator which contains a crystal according to claim 5.

13. A cesium-lithium-borate crystal having a chemical composition consisting of $Cs_{2(1-z)}Li_2L_zB_{12}O_{20}$, wherein L is at least one alkaline earth metal ion, Mg or Be and wherein $0<z<1$.

14. The crystal according to claim 13, wherein L is at least one alkaline earth metal ion selected from the group consisting of Ba, Sr and Ca.

15. A method for manufacturing a crystal as claimed in claim 13, which comprises forming a mixture comprising a source of Cs, Li, B, O, and L, wherein L has the same meaning as defined in claim 13, and heating and melting the mixture to a temperature sufficient to form said crystal.

16. The method for manufacturing a crystal according to claim 15, which comprises a step of growing the crystal by the melt method.

17. The method for manufacturing a crystal according to claim 15, which comprises a step of growing the crystal by the flux method.

18. A frequency converting apparatus which contains a crystal according to claim 13.

19. The apparatus according to claim 18, which generates a second, third, fourth or fifth harmonic of a laser.

20. An optical parametric oscillator which contains a crystal according to claim 13.

* * * * *